United States Patent [19]

Suzuki et al.

[11] 4,163,291
[45] Jul. 31, 1979

[54] INPUT-OUTPUT CONTROL CIRCUIT FOR FIFO MEMORY

[75] Inventors: Seigo Suzuki, Yokohama; Yoshiaki Moriya, Ingai, both of Japan

[73] Assignee: Tokyo Shibaura Electric Co., Ltd., Japan

[21] Appl. No.: 732,965

[22] Filed: Oct. 15, 1976

[30] Foreign Application Priority Data

Oct. 15, 1975 [JP] Japan .................. 50-123235
Oct. 15, 1975 [JP] Japan .................. 50-123237
Nov. 18, 1975 [JP] Japan .................. 50-138550

[51] Int. Cl.² ............... G11C 7/00; G11C 19/00
[52] U.S. Cl. .................. 365/221; 307/221 R; 365/78; 365/194; 365/195
[58] Field of Search ...... 340/173 R, 173 FF, 173 RC; 307/221 R, 291; 365/78, 195, 205, 221, 194

[56] References Cited
U.S. PATENT DOCUMENTS

| | | | |
|---|---|---|---|
| 3,254,233 | 5/1966 | Kobayashi et al. | 365/78 |
| 3,460,098 | 8/1969 | Blauw | 307/221 R |
| 3,665,424 | 5/1972 | Scharkowitz | 340/173 R |
| 3,736,575 | 5/1973 | Mallerich, Jr. | 365/78 X |
| 3,893,086 | 7/1975 | Nanya | 365/78 |
| 3,916,323 | 10/1975 | Moriyama et al. | 307/221 R |
| 3,953,838 | 4/1976 | Gilberg et al. | 365/78 |
| 4,070,630 | 1/1978 | Hepworth et al. | 307/221 R |

*Primary Examiner*—Bernard Konick
*Assistant Examiner*—Donald McElheny, Jr.
*Attorney, Agent, or Firm*—Finnegan, Henderson, Farabow & Garrett

[57] ABSTRACT

In transmitting data between a plurality of sequentially connected FIFO type memory elements by controlling a binary coded signal a circuit element is provided in a manner to correspond to each memory element, so as to indicate a data storage state. A circuit element comprises flip-flop constructed of two NOR circuits, the input of each NOR circuit being connected to an input control line or an output control line, and inverters each of which is connected to the output of the NOR circuit. The provision of such circuit element permits an automatic data transmission control according to a data storage state in a specified memory element and a data storage state in the next stage memory element.

8 Claims, 9 Drawing Figures

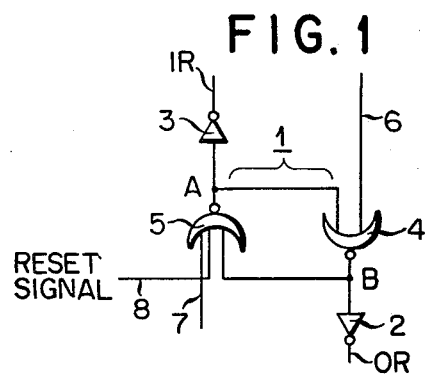

INPUT-OUTPUT CONTROL CIRCUIT FOR FIFO MEMORY

BACKGROUND OF THE INVENTION

This invention relates to a data control device and in particular a data control device suited to control a data transfer in a FIFO (First in/First out) type memory.

A FIFO type memory comprises a plurality of sequentially connected memory elements extending from the input terminal toward the output terminal thereof. In the FIFO type memory the storage of input data is sequentially started from that memory element at the output side of the memory and, when data is delivered, a data transfer is started from that memory element at the output side of the memory. In this case, data stored in each memory element are sequentially transferred to an "data-empty" memory cell at the output side of the memory.

This type of memory is controlled in the following way. A first step is to obtain, in addition to a data representing a data storage state in a specified memory element, data representing the data storage states of those memory elements situated immediately before and after the specified memory element. Then, in order to effect a determination of whether data should be transferred to the next stage memory element or data should be received from the preceding stage memory element complicated gate circuits are required. Furthermore, an extra signal is required to indicate whether all the memory elements are ready for data storage or ready for data readout. Moreover, a data transfer control is difficult in a case where a different data transfer time is involved in transferring data from one memory element to the next stage memory element.

SUMMARY OF THE INVENTION

One object of this invention is to provide a data control device which is simple in arrangement and can control a data transfer particularly in a FIFO type memory.

Another object of this invention is to provide a data control device having a means by which a knowledge of whether a memory as a whole is ready for data storage or ready for data readout is readily obtained.

Another object of this invention is to provide a data control device which is simple in arrangement and permits data transfer even when a different data transfer time is involved between memory elements.

According to this invention, a plurality of sequentially connected circuit elements each including a flip-flop circuit and an inverter connected to the output of the flip-flop circuit are provided to effect data transfer in a FIFO type memory comprised of a plurality of memory elements, each memory element corresponding to the circuit element. In this arrangement, the memory is so controlled as to permit automatic data transfer based on the data storage state of a specified memory element and the data storage state of the next stage memory element to which data transfer is effected.

BRIEF DESCRIPTION OF THE DRAWING

FIG. 1 is a circuit diagram showing a fundamental data control circuit element of a data control device according to this invention;

FIG. 2 is a combination of a memory with a data control device according to another embodiment of this invention;

FIG. 3 is a circuit diagram of a control circuit element according to another embodiment of this invention;

FIG. 4 is a block circuit arrangement in which a plurality of control circuit elements as shown in FIG. 3 are provided;

DETAILED DESCRIPTION OF THE PREFERRED EMBODIMENTS

Figure 5:
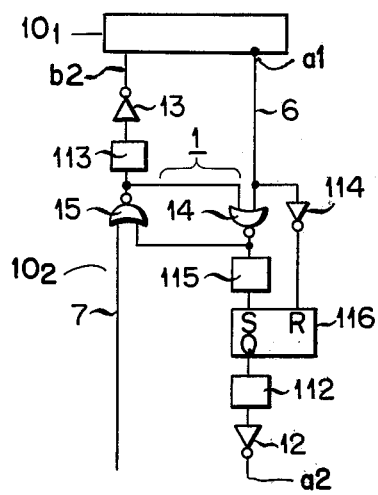
FIGS. 5 and 7 are circuit diagrams showing control circuit elements according to embodiments of this invention.

One embodiment of this invention will now be explained by referring to the accompanying drawings.

FIG. 1 shows a fundamental data control circuit element comprising a flip-flop 1 and inverters 2 and 3 and adapted to control a single memory element. The flip-flop 1 comprises, for example, first and second NOR circuits 4 and 5 as conventionally known in the art. An input control line 6 is connected to the input terminal of the first NOR circuit 4 and the output of the first NOR circuit 4 is connected to the first inverter 2 and to the input terminal of the second NOR circuit 5. An output control line 7 and reset signal line 8 are connected to the input terminals of the second NOR circuit 5. The output of the second NOR circuit 5 is connected to the input terminal of the first NOR circuit 4 and to the second inverter 3. The output of the first inverter 2 is connected to a line OR for indicating the state that a data is stored in a memory element, i.e. the output ready state, and the output of the second inverter 3 is connected to a line IR for indicating the state that the memory element is empty, i.e., the input ready state.

The operation of the fundamental data control circuit FIG. 1 will now be explained below.

First of all, explanation will be made of the case where a data is inputted from the fundamental circuit element to the corresponding memory element. In this case the output control line 7 is at a "0" level and a reset signal is initially delivered through the reset line to the second NOR circuit 5 to cause a junction A to become a "0" level. At this time the line IR becomes a logic "1" level and the memory element corresponding to the fundamental data control circuit becomes empty, indicating a data input ready state. An input pulse signal is applied from the input control line 6 to the first NOR circuit 4 to cause a junction B to become a "0" level. As a result, the junction A becomes a "1" level and the line OR becomes a "1" level. A data is stored in the memory element corresponding to the fundamental data control circuit. This means that no fresh data is stored in this memory element. At this time the line IR becomes a "0" level, indicating that the data is stored in the memory element. Even if a next binary coded pulse signal is applied from the input control line 6, the junction B is maintained at the "0" level and the junction A is also maintained at the "1" level. In consequence, no data is stored in the corresponding memory element.

Let us now explain the case where a data is taken out from the corresponding memory element. In this case, the input control line is at the "0" level. Since a data is stored in the memory element the junction A is at the "1" level and the line OR is at the "1" level. At this time the junction B is at the "0" level. When a binary coded pulse signal ("1" level) is applied to the output control line 7 the junction A becomes a "0" level. As a result, the data in the corresponding memory element is transferred to the next stage memory element and the former memory element becomes empty. The line IR becomes a "1" level, the junction B becomes a "1" level, and the line OR becomes a "0" level. This means that the data is not ready to be read out of the corresponding memory cell. Since the junction B is at the "1" level, even if the output control line 7 is at the "0" level, the junction A is maintained at the "0" level. In consequence, even when the next pulse signal is applied to the output control line 7, the junction A is at the "0" level and the junction B is held at the "1" level. This means that the corresponding memory element is empty. Thus, no data is taken out of the corresponding memory element. As mentioned above, the "1" level at the junction A means that the memory element is in the "occupied" state and the "1" level at the junction B means that the memory element is in the "empty" state.

FIG. 2 shows a practical circuit arrangement in which the fundamental data control circuit element in FIG. 1 is combined with the corresponding memory element. Memory elements 111 and 121 are sequentially interconnected in a single row to provide a FIFO type memory. Since each memory element requires one fundamental data control circuit element, if the FIFO type memory has 1000 words, 1000 fundamental control circuit elements are required.

FIG. 2 shows a data control circuit elements corresponding to two-stage memory element for convenience of explanation. Even if the number of the memory elements is increased, the operation of the resultant data control circuit will be evident from the embodiment shown in FIG. 2.

The fundamental control circuit shown in FIG. 2 includes, in addition to the circuit components in FIG. 1, first delay circuits 112, 122 and second delay circuits 113 and 123. The first delay circuit 112 is connected between a first NOR circuit 14 and a first inverter 12; the first delay circuit 122, between a first NOR circuit 24 and a first inverter 22; the second delay circuit 113, between a second NOR circuit 15 and a second inverter 13; and the second delay circuit 123, between a second NOR circuit 25 and a second inverter 23. The NOR circuits 14, 24 correspond to the first NOR circuit 4 in FIG. 1, the inverters 12, 22 correspond to the first inverter 2 in FIG. 1, the NOR circuits 15, 25 correspond to the second NOR circuit 5, and the inverters 13 and 23 correspond to the second inverter 3 in FIG. 1. The output of the second delay circuit 113 and first NOR circuit 14 is connected to the first NOR circuit 214 for gate control, and the output of the second delay circuit 123 and first NOR circuit 24 is connected to the first NOR circuit 224 for gate control. The outputs of the NOR circuits 214 and 224 are connected to the gates 115 and 125 of the memory elements, respectively. The gates 115 and 125 effect the input control of data transferred through a data line 100 to the memory elements 111 and 121.

Lines OR1 and OR2 correspond to the line OR in FIG. 1; lines IR1 and IR2, to the line IR in FIG. 1; junctions A1 and A2, to the junction A in FIG. 1; and junctions B1 and B2, to the junction B in FIG. 1. The lines OR1, OR2, IR1 and IR2 have input and output control signal output terminals a1, a2, b1 and b2, respectively. The data control circuit in FIG. 2 has an input control line 6, output control line 7 and reset signal line 8 as in the case of the embodiment shown in FIG. 1. The line OR1 of the first stage control circuit element 10₁ is connected to the input of the first NOR circuit 24 of the second stage control circuit element 10₂, and the line IR2 of the second stage control circuit element is connected to the input of the second NOR circuit 15 of the first stage control circuit element. The NOR circuit may be constructed of a NAND circuit.

The operation of the data control circuit and memory as shown in FIG. 2 will be described below.

When a data is supplied through the data line 100 to the memory elements 111 and 121, the output control line 7 is at the "0" level. A reset signal is initially applied through the reset signal line 8 to the second NOR circuits 15 and 25 to cause the junctions A1 and A2 to become zero levels. Also, the output control signal output terminals b1 and b2 have a "1" level. Upon applying a pulse signal to the input control line 6 the junction B1 becomes zero. Then, the junction A2 remains zero and the line IR2 and terminal b2 are at a "1" level. Thus, a "0" level is held at the junction A1. As B1=0 and A1=0, an output "1" signal appears at the gate control NOR circuit 214, causing the gate 115 to be open to permit a data to be transferred to the memory element 111. Since, however, the junction A1 is maintained at the "0" level, no data is stored into the memory element 111. With the junction B1 at the "0" level the line OR1 is at a "1" level. In consequence, the junction B2 in the next stage control circuit is at a "0" level and the junction A2 is at a "1" level. Since the output of the second delay circuit 123 is maintained during the delay time at the "0" level even when the junction A2 becomes a "1" level, the output of the gate control NOR circuit 224 becomes a "1" level, causing the gate 125 to be opened to permit a data to be transferred to the memory element 121 for storage. With the junction A2 at the "1" level the line IR2 and the terminal b2 become a "0" level. The storage of the data in the memory element 121 is indicated by the fact that the terminal b2 is at the "0" level. Upon applying a next pulse to the input control line 6 the junction B1 again becomes a "0" level and the junction A1 becomes a "1" level. Even when the junction A1 becomes a "1" level, the second delay circuit 113 is maintained during the delay time at the "0" level. Thus, during the delay time, the gate 115 is opened to permit a data to be transferred from the data line 100 to the memory element 111 for storage. With the junction A1 at the "1" level the line IR1 and the terminal b1 have a "0" level. The storage of the data in the memory element 111 is indicated by the fact that the terminal b1 becomes a "0" level.

When data are supplied to the memory through the data line 100, sequential data storage is effected from that memory element 121 closer to the output side. In this way, the memory is controlled by the data control circuit of this invention.

When data is derived from the memory, the input control line 6 is at a "0" level. Suppose that with the junctions A1 and A2 at the "1" level data is stored in the memory elements 111 and 121. When in this case a binary coded signal is applied to the output control line 7, the junction A2 becomes a "0" level. Then, after the delay time of the delay circuit 123 passes, the output of the delay circuit 123 becomes a "0" level. As the junction A1 is at a "1" level, the junction B2 is kept a "0" level, thereby causing the output of the NOR circuit 224 for a gate control to produce a "1" level signal to open the gate 125. Thus, data stored in the memory element 111 is taken out. When the output of the delay circuit 123 is at a "0" level, the junction A1 becomes a "0" level and thus the junction B1 becomes a "1" level. Thereafter, the terminal a1 becomes a "0" level and this shows that data is derived from the memory element 111 and that the memory element 111 is now empty. Thus, where the data readout is effected, the data is transferred from the memory element closer to the input side to that closer to the output side.

FIG. 3 shows an embodiment in which N fundamental data control circuit elements are connected to constitute an N-stage circuit. A "1" level on a line IR connected to the output of an inverter 13 indicates that data is not stored in all of N memory elements corresponding to the N control circuit elements. A "0" level on the line IR indicates that data is stored in each of all the memory elements and that further data can not be inputted into the memory element. A "1" level on a line OR connected to the output of an inverter N2 indicates that data is still stored in the memory element and a "0" level on the line OR indicates that nor memory is occupied by data and that data can not be read out of the memory element.

In an embodiment shown in FIG. 4, $101_1 \ldots 101_M$ each show the data control circuit as shown in FIG. 3; $6_1 \ldots 6_M$ correspond to the input control line 6; $7_1 \ldots 7_M$, to the output control line 7; and IR1 ... IRM, to the line IR; OR1 ... ORM, to the line OR. The line OR1 of the control circuit $101_1$ is connected to the input control line $6_2$ of the next stage control circuit $101_2$ and the output control line $7_1$ is connected to the line IR2 of the next stage control circuit $101_2$. In this way, the control circuits $101_1, 101_2 \ldots 101_M$ are connected up to an M stage.

In the embodiment of FIG. 4 the line IR1 indicates whether or not data is stored in all the memory elements, i.e., all the memories are occupied by data and the line ORM indicates whether or not data is read out from all the memory elements, i.e., all the memory elements are empty. Even in this embodiment, data read-in is effected in the following way. That is, data is sequentially stored, starting with that empty memory element closest to the output side. The data readout is carried out in the following way. That is, the content in the memory element corresponding to the control circuit element at the output side of the control circuit $101_M$ is first read out and then the content of the preceding stage memory element is sequentially transferred for each stage to the memory element at the output side.

Let us explain the other embodiments by referring to FIGS. 5 to 9. Even when a data transfer speed is different between memory elements, these embodiments, can control data transfer by varying the width of an input control pulse signal to a predetermined memory element.

In the embodiment shown in FIG. 5 the width of an output pulse signal from the first inverter 12 in FIG. 2 i.e. an input control signal for the next stage control circuit element is made narrower than that of an input pulse from the input control line 6.

That is, use is made of a flip-flop 116 of the type in which when a "1" level signal is supplied to an S input a Q output becomes a "0" level and when the S and R inputs are both at a "0" level the Q output is invariable. Between the output of a NOR gate 14 and the S input of the flip-flop 116 is connected a delay circuit 115 having an amount of delay equal to the width of a pulse to be generated from an output inverter 12. The input and output of an inverter 114 are connected to the terminal a1 and the R input of the flip-flop 116, respectively. The Q output of the flip-flop 116 is inputted through a first delay circuit 112 to a first inverter 12. The amount of delay of the delay circuit 112 needs only to be to such an extent that an input pulse $F_6$ (see FIG. 6) from the input control signal output terminal a1 of the data control circuit element $10_1$ and an output pulse $F_{12}$ (see FIG. 6) from the first inverter 12 do not overlap each other and the delay circuit 112 is not necessarily required in this respect.

Figure 6:
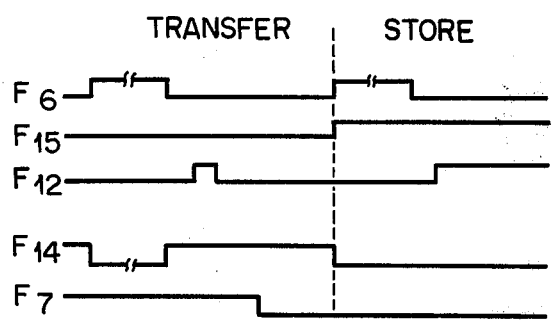
FIG. 6 is a timing chart of a control circuit element shown in FIG. 5.

FIG. 6 is a timing chart showing the operation of the above-mentioned control circuit. The waveform $F_6$ is an input control signal from the input control line 6, a waveform $F_{15}$ is an output from a NOR gate 15, the waveform $F_{12}$ is an output from the inverter 12, a waveform $F_7$ is a signal from an output control line 7. The signal $F_7$ corresponds to a data readout instruction.

Suppose that in FIG. 5 the output of a NOR gate 15 is at a "0" level and the output of the NOR gate 14 at a "1" level. If in this case a "1" level signal is being inputted to an output control line 7, a flip-flop 1 undergoes no inversion even if an input from the terminal a1 is subjected to any variation, and even if a pulse of any wide width is inputted as an input signal from the terminal a1 a pulse with a time width determined by the delay circuit 115 can be non-overlappingly delivered, as indicated by a left half section of a waveform diagram in FIG. 6, to the inverter 12. When the input of the output control line 7 becomes a "0" level and a "1" level input pulse signal is inputted from the terminal a1, the flip-flop 1 is subjected to inversion as indicated by a right half section of a waveform diagram in FIG. 6 and the output of the inverter 12 varied stepwise to a "1" level without any overlap with the input signal.

Figure 7:
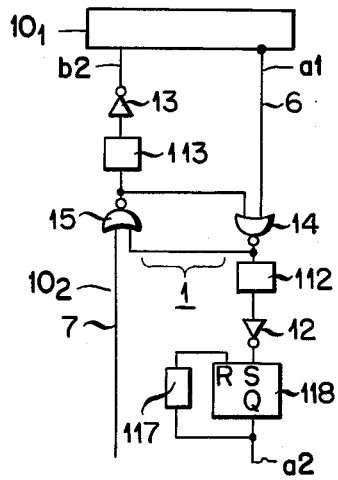

FIG. 7 shows the case where a wide-width input signal for a next stage control circuit element is delivered from a narrow-width input control signal. In the embodiment shown in FIG. 7 use is made of a flip-flop 118 similar to the above-mentioned flip-flop 116. The output of a NOR gate 14 is connected to an S input of the flip-flop 118 through a delay circuit 112 having a delay time greater than the time width of an input pulse from the terminal a1 and through an inverter 12. A Q output of the flip-flop 118 is fed back to an R input thereof through a delay circuit 117 having a delay time equal to the time width of an output pulse from the Q output of the flip-flop 118. The other part of the circuit arrangement in FIG. 7 substantially corresponds to the arrangement in FIG. 5.

Figure 8:
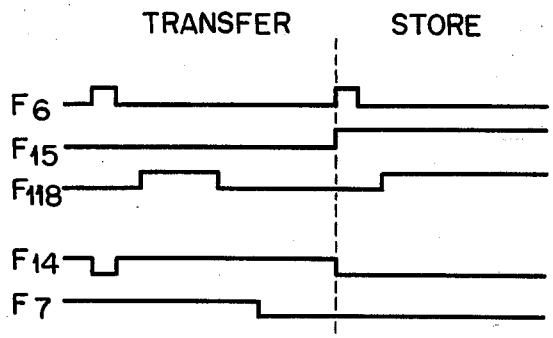
FIG. 8 is a timing chart of a control circuit element shown in FIG. 7.

FIG. 8 is a timing chart showing the operation of the above-mentioned control circuit. A waveform $F_6$ is an input control signal from the terminal a1; a waveform $F_{15}$, an output of a NOR gate 15; a waveform 118, a Q output of the flip-flop 118; a waveform $F_{14}$, an output of the NOR gate 14; and a waveform 7, a signal of the output control line 7. The signal of the output control line 7 corresponds to a data readout signal.

Suppose that in FIG. 7 the output of a NOR gate 15 is at a "0" level and the output of the NOR gate 14 is at a "1" level. If in this case a "1" level signal is being inputted to the output control line 7 the flip-flop undergoes no inversion even when an input from the terminal a1 is subjected to any variation, and when an input pulse signal is inputted from the terminal a1 the flip-flop 118 can generate a pulse, such as the waveform $F_{118}$, having a time width determined by the delay circuit 117. When the input of the output control line 7 becomes a "0" level and a "1" level input pulse signal is inputted from the terminal a1 6, the flip-flop 1 undergoes inversion as indicated by a right half section of the waveform in FIG. 8 and the Q output of the flip-flop 118 varied stepwise to a "1" level without any overlap with the input pulse.

Upon comparison in waveform between the embodiment shown in FIG. 5 and the embodiment shown in FIG. 7 it will be understood that a conversion from the input waveform to the output waveform, i.e., a width conversion of the input control signal to the next stage is effected. If the control circuit as shown in FIGS. 5 and 7 is used, a data transmission control can be effected even in cases where a different delay time is involved between data transmission lines each connecting two adjacent memory elements or a different access time is involved between memory elements.

When in the above-mentioned embodiments the output of the NOR gate 15 is at a "0" level and the output of the NOR gate is at a "1" level an input signal is transferred from the terminal a1 to the inverter 12 (FIG. 5) or to the flip-flop 118 (FIG. 7). It is also possible to effect a signal conversion in the opposite direction. That is, an arrangement from the terminal a1 to the output inverter 12 or to the flip-flop 118 can be used an as arrangement from the output control line 7 to the inverter 13.

Figure 9:
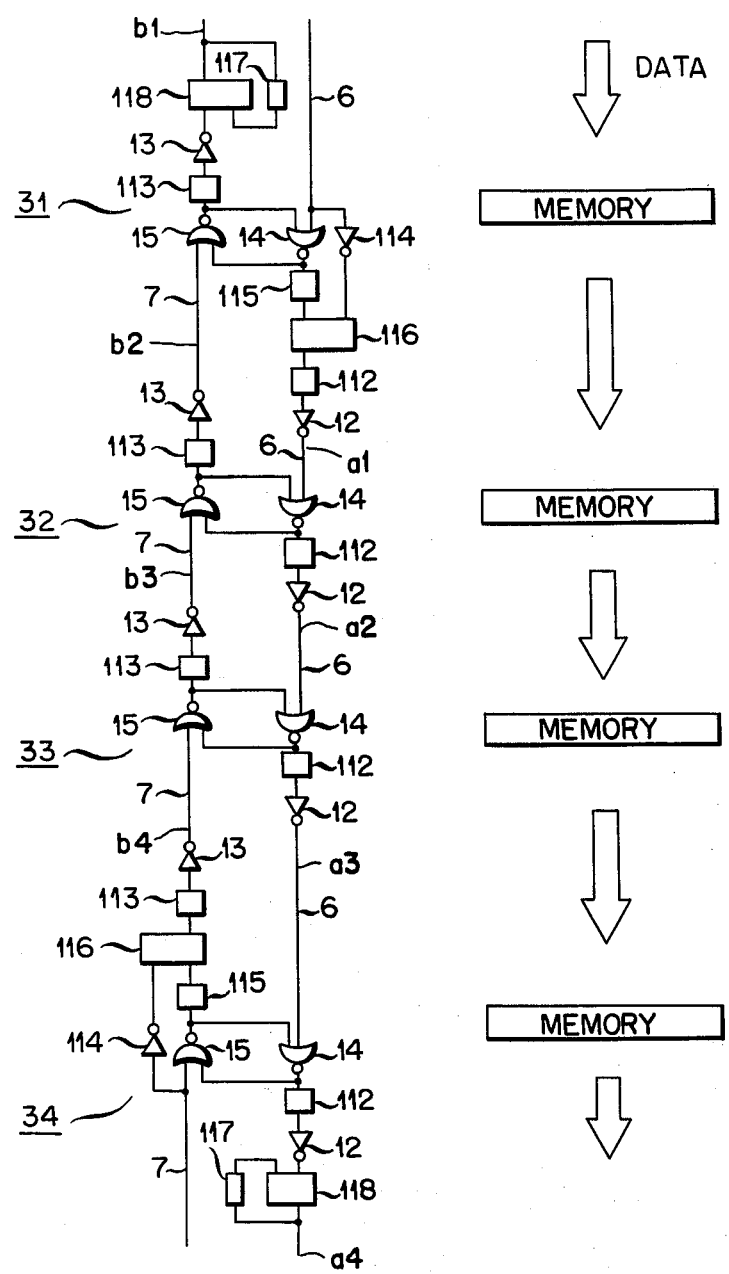
FIG. 9 is a circuit diagram showing a combination of control circuit devices shown in FIGS. 5 and 7.

FIG. 9 shows the case where the above-mentioned control circuit elements are applied to a data control circuit corresponding to a 4-word FIFO type memory. In FIG. 9 identical reference numerals are employed to designate parts or elements corresponding to those shown in the above-mentioned embodiments. The circuit arrangement shown in FIG. 9 is constructed in an LSI (large scale integration) form. Since an input control signal transferred from the other LSI arrangement to an input control line 6 of a control circuit element 31 is slow in a data transmission speed, it is converted at the control circuit element 31 to a narrow-width pulse. Within the LSI arrangement a data transmission speed is rapid and for this reason the first stage control circuit element (FIG. 2) can be used as control circuit elements 32, 33. A control signal fed from the output of a flip-flop 118 in a control circuit element 34 to the other LSI arrangement involves a slow data transmission speed and is converted to a wide-width pulse and outputted as such. Since a readout data from the LSI arrangement in FIG. 9 to the other LSI arrangement is slow in speed, a data readout signal is inputted as a wide-width pulse into an output control line 7 of the control circuit element 34. The wide-width pulse is converted at the control circuit element 34 to a narrow-width pulse. A readout signal from the output of the flip-flop 118 is again converted to a wide-width pulse and delivered to the other LSI arrangement. The control circuit elements 31, 32, 33 and 34 have input and output control signal output terminals a1, b1; a2, b2; a3, b3; a4, b4, respectively.

As described above, even when a different data transmission time is involved a data transmission control can be effected (in the embodiments of FIGS. 5, 7 and 9) by the use of a means for varying the width of the input control signal, which could not be attained in the circuit arrangement as shown in FIGS. 1 and 2.

What is claimed is:

1. A memory input-output control device for controlling the read-write operation of a first-in first-out memory having a plurality of sequentially-arranged memory elements (111, 121), comprising an input control line (6); an output control line (7); and a plurality of data control circuit elements ($10_1$, $10_2$) sequentially connected between the input and output control lines (6, 7), each of said data control circuit elements being connected to one of the plurality of sequentially-arranged memory elements and comprising a circuit having an input control signal output terminal (a1 or a2) and an output control signal output terminal (b1 or b2), wherein the input control line, during a write operation, is supplied with an input control pulse signal and the output control signal output terminal (b1 or b2) of each of said data control circuit elements, in response to the input control pulse signal, has a binary signal representing the full or empty state of the respective memory element, and wherein the output control line, during a read operation, is supplied with an output control pulse signal and the input control signal output terminal of each of said data control circuit elements, in response to the output control pulse signal, has a binary signal representing the full or empty state of the respective memory element.

2. A memory input-output control device according to claim 1, wherein each of the data control circuit elements comprises a first gate circuit (14 or 24) having a first input terminal connected to the input control signal output terminal (a1 or a2) of the preceding data control circuit element, a second input terminal and an output terminal; a first inverter (12 or 22) having an input terminal adapted to receive an output of the first gate circuit (14 or 24) and an output terminal, a second gate circuit (15 or 25) having at least two input terminals, one connected to the output terminal of the first gate circuit and the other connected to the output control signal output terminal (b1 or b2) of the next stage data control circuit element, respectively, and having an output terminal connected to the second input terminal of the first gate circuit (14 or 24); and a second inverter (13 or 23) having an input terminal connected to the output terminal of the second gate circuit.

3. A memory input-output control device according to claim 2, wherein each of the first and second gate circuits is a NOR gate circuit.

4. A memory input-output control device according to claim 1, wherein some of the data control circuit elements ($10_1$, $10_2$) each comprise a first NOR gate circuit (14 or 24) having a first input terminal connected to the input control signal output terminal (a1 or a2) of the preceding stage data control circuit element, a second input terminal and an output terminal; a first delay circuit (112 or 122) having an input terminal connected to the output terminal of the first NOR gate circuit (14 or 24) and an output terminal; and a first inverter (12 or 22) having an input terminal connected to the output terminal of the first delay circuit and an output terminal; a second NOR circuit (15 or 25) having a first input terminal connected to the output control signal output terminal (b1 or b2) of the next stage data control circuit element, a second input terminal connected to the output terminal of the first NOR gate circuit and an output terminal; a second delay circuit (113 or 123) having an input terminal connected to the output terminal of the second NOR gate circuit and an output terminal; and a second inverter (13 or 23) having an input terminal connected to the output terminal of the second delay circuit.

5. A memory input-output control device according to claim 4, wherein some of the data control circuit elements each further include a flip-flop circuit (118) having a set terminal connected to the output terminal of the first inverter (12), a reset terminal and an output terminal; and a third delay circuit (117) connected between the reset and output terminals of the flip-flop circuit (118).

6. A memory input-output control device according to claim 4, wherein each of the data control circuit elements further includes a gate circuit (214 or 224) connected to the output terminals of the first NOR gate circuit (14 or 24) and the second delay circuit (113 or 123) to control the write and read operations of the corresponding memory element in response to the outputs of the first NOR gate circuit and the second delay circuit.

7. A memory input-output control device according to claim 1, wherein each of the data control circuit elements comprises a first NOR gate circuit (14) having a first input terminal connected to the input control signal output terminal (a1) of the preceding data control circuit element, a second input terminal and an output terminal; a first inverter (114) having an input terminal connected to the input control signal output terminal (a1) and an output terminal; a first delay circuit (115) having an input terminal connected to the output terminal of the first NOR gate circuit and an output terminal; a flip-flop circuit (116) having a set terminal connected to the output terminal of the first delay circuit (115), a reset terminal connected to the output terminal of the first inverter (114) and an output terminal; a second delay circuit (112) having an input terminal connected to the output terminal of the flip-flop circuit and an output terminal; a second inverter (12) having an input terminal connected to the output terminal of the second delay circuit and an output terminal connected to the corresponding input control signal output terminal, a second NOR gate circuit (15) having a first input terminal connected to the output control signal output terminal (b1) of the next stage data control circuit element, a second input terminal connected to the output terminal of the first NOR gate circuit and an output terminal connected to the second input terminal of the first NOR gate circuit; a third delay circuit (113) having an input terminal connected to the output terminal of the second NOR gate circuit and an output terminal; and a third inverter (13) having an input terminal connected to the output terminal of the third delay circuit and an output terminal connected to the corresponding output control signal output terminal.

8. A memory input-output control device for controlling the read-write operation of a first-in first-out memory composed of a plurality of memory elements sequentially arranged, comprising an input control line (6) for receiving an input control pulse signal in a write operation; an output control line (7) for receiving an output control pulse signal in a readout operation; and a data control circuit connected in series between the input and output control lines, said data control circuit comprising a first data control circuit element having means for reducing the width of the input control pulse signal and input and output data control signal output terminals (a1, b1), a second data control circuit element (34) having means for reducing the width of the output control pulse signal and input and output data control signal output terminals (a4, b4) and a plurality of series-connected third data control circuit elements (32 and 33) connected in series between the first and second data control circuit elements (31 and 34), each of said third data control elements having means for imparting no change to the width of the input control pulse signal passed through the first data control circuit element (31) and to the width of the output control pulse signal passed through the second data control circuit element (34) and input and output data control signal output terminals (a2, b2 or a3, b3), the first data control circuit element including means for enlarging the width of the output control pulse signal passed through the second and third control circuit elements and the second data control circuit element including means for enlarging the width of the input control pulse signal passed through the first and third data control circuit elements, said input and output data control signal output terminals each having a binary signal representing the full or empty state of the corresponding memory element.

* * * * *

UNITED STATES PATENT AND TRADEMARK OFFICE
CERTIFICATE OF CORRECTION

PATENT NO. : 4,163,291

DATED : July 31, 1979

INVENTOR(S) : SEIGO SUZUKI ET AL

It is certified that error appears in the above-identified patent and that said Letters Patent are hereby corrected as shown below:

Column 10, line 19, after "element" insert -- (31) --.

Signed and Sealed this

Twentieth Day of November 1979

[SEAL]

Attest:

RUTH C. MASON
Attesting Officer

LUTRELLE F. PARKER
Acting Commissioner of Patents and Trademarks